United States Patent
Henley et al.

(10) Patent No.: US 7,598,153 B2
(45) Date of Patent: Oct. 6, 2009

(54) METHOD AND STRUCTURE FOR FABRICATING BONDED SUBSTRATE STRUCTURES USING THERMAL PROCESSING TO REMOVE OXYGEN SPECIES

(75) Inventors: Francois J. Henley, Aptos, CA (US); James Andrew Sullivan, Woodside, CA (US); Sien Giok Kang, Dublin, CA (US); Philip James Ong, Milpitas, CA (US); Harry Robert Kirk, Campbell, CA (US); David Jacy, San Jose, CA (US); Igor Malik, Palo Alto, CA (US)

(73) Assignee: Silicon Genesis Corporation, San Jose, CA (US)

( * ) Notice: Subject to any disclaimer, the term of this patent is extended or adjusted under 35 U.S.C. 154(b) by 450 days.

(21) Appl. No.: 11/394,597

(22) Filed: Mar. 31, 2006

(65) Prior Publication Data

US 2007/0232022 A1 Oct. 4, 2007

(51) Int. Cl.
*H01L 21/30* (2006.01)
*H01L 21/46* (2006.01)

(52) U.S. Cl. .................. 438/455; 438/406; 438/419; 257/E21.09; 257/E23.005

(58) Field of Classification Search .......... 438/406, 438/409, 419, 455, 479, 481; 257/E21.09, 257/E23.005
See application file for complete search history.

(56) References Cited

U.S. PATENT DOCUMENTS 2,981,877 A 4/1961 Noyce (Continued)

FOREIGN PATENT DOCUMENTS

WO WO 99/08316 2/1999

OTHER PUBLICATIONS

Ahn, et. al., Stability of Interfacial Oxide Layers during Silicon Wafer Bonding, Journey of Applied Physics, 65(2), Jan. 15, 1989, pp. 561-563.

(Continued)

*Primary Examiner*—Phuc T Dang
(74) *Attorney, Agent, or Firm*—Townsend and Townsend and Crew LLP

(57) ABSTRACT

A method for fabricating bonded substrate structures, e.g., silicon on silicon. In a specific embodiment, the method includes providing a thickness of single crystal silicon material transferred from a first silicon substrate coupled to a second silicon substrate. In a specific embodiment, the second silicon substrate has a second surface region that is joined to a first surface region from the thickness of single crystal silicon material to form of an interface region having a first characteristic including a silicon oxide material between the thickness of single crystal silicon material and the second silicon substrate. The method includes subjecting the interface region to a thermal process to cause a change to the interface region from the first characteristic to a second characteristic. In a specific embodiment, the second characteristic is free from the silicon oxide material and is an epitaxially formed silicon material provided between the thickness of single crystal silicon material and the second silicon substrate. The method includes maintaining the interface region free of multiple voids during the thermal process to form the epitaxially formed silicon material to electrically couple the thickness of single crystal silicon material to the second silicon substrate.

48 Claims, 11 Drawing Sheets

U.S. PATENT DOCUMENTS

| | | | |
|---|---|---|---|
| 4,363,828 | A | 12/1982 | Brodsky et al. |
| 4,585,671 | A | 4/1986 | Kitagawa et al. |
| 4,696,758 | A | 9/1987 | Ovshinsky et al. |
| 5,120,394 | A | 6/1992 | Mukai |
| 5,670,411 | A * | 9/1997 | Yonehara et al. ............ 438/459 |
| 5,789,030 | A | 8/1998 | Rolfson |
| 5,877,070 | A | 3/1999 | Goesele et al. |
| 6,013,563 | A | 1/2000 | Henley et al. |
| 6,033,974 | A | 3/2000 | Henley et al. |
| 6,100,166 | A | 8/2000 | Sakaguchi et al. |
| 6,103,599 | A | 8/2000 | Henley et al. |
| 6,171,965 | B1 | 1/2001 | Kang et al. |
| 6,180,496 | B1 | 1/2001 | Farrens et al. |
| 6,287,941 | B1 | 9/2001 | Kang et al. |
| 6,326,279 | B1 * | 12/2001 | Kakizaki et al. ............ 438/406 |
| 6,368,930 | B1 | 4/2002 | Enquist |
| 6,455,399 | B2 | 9/2002 | Malik et al. |
| 6,500,694 | B1 | 12/2002 | Enquist |
| 6,534,381 | B2 | 3/2003 | Cheung et al. |
| 6,563,133 | B1 | 5/2003 | Tong |
| 6,586,785 | B2 | 7/2003 | Flagan |
| 6,627,531 | B2 | 9/2003 | Enquist |
| 6,653,212 | B1 | 11/2003 | Yamanaka et al. |
| 6,699,531 | B1 | 3/2004 | Fukiage |
| 6,716,751 | B2 | 4/2004 | Todd |
| 6,723,606 | B2 | 4/2004 | Flagan |
| 6,740,909 | B2 | 5/2004 | Enquist |
| 6,756,281 | B2 | 6/2004 | Enquist |
| 6,771,410 | B1 | 8/2004 | Bourianoff |
| 6,804,062 | B2 | 10/2004 | Atwater |
| 6,818,529 | B2 | 11/2004 | Bachrach et al. |
| 6,821,825 | B2 | 11/2004 | Todd et al. |
| 6,822,326 | B2 | 11/2004 | Enquist et al. |
| 6,858,107 | B2 | 2/2005 | Ghyselen et al. |
| 6,858,517 | B2 | 2/2005 | Martinez et al. |
| 6,864,585 | B2 | 3/2005 | Enquist |
| 6,867,073 | B1 | 3/2005 | Enquist |
| 6,875,671 | B2 | 4/2005 | Faris |
| 6,884,696 | B2 | 4/2005 | Aga et al. |
| 6,900,115 | B2 | 5/2005 | Todd |
| 6,902,987 | B1 | 6/2005 | Tong et al. |
| 6,905,557 | B2 | 6/2005 | Enquist |
| 6,962,858 | B2 | 11/2005 | Neyret et al. |
| 6,962,859 | B2 | 11/2005 | Todd et al. |
| 7,019,339 | B2 | 3/2006 | Atwater |
| 7,029,995 | B2 | 4/2006 | Todd et al. |
| 2002/0168868 | A1 | 11/2002 | Todd |
| 2002/0173113 | A1 | 11/2002 | Todd |
| 2002/0190269 | A1 | 12/2002 | Atwater |
| 2002/0197831 | A1 | 12/2002 | Todd et al. |
| 2003/0082300 | A1 | 5/2003 | Todd et al. |
| 2003/0095340 | A1 | 5/2003 | Atwater |
| 2003/0111013 | A1 | 6/2003 | Oosterlaken et al. |
| 2003/0119280 | A1* | 6/2003 | Lee et al. .................... 438/459 |
| 2003/0129545 | A1 | 7/2003 | Kik |
| 2003/0203593 | A1* | 10/2003 | Beaman ..................... 438/419 |
| 2003/0230629 | A1 | 12/2003 | Bourianoff |
| 2003/0230778 | A1 | 12/2003 | Park et al. |
| 2004/0214434 | A1 | 10/2004 | Atwater |
| 2005/0026400 | A1 | 2/2005 | Todd et al. |
| 2005/0026432 | A1 | 2/2005 | Atwater |
| 2005/0085049 | A1 | 4/2005 | Atwater |
| 2005/0092235 | A1 | 5/2005 | Brabant et al. |
| 2005/0142879 | A1 | 6/2005 | Atwater |
| 2005/0153524 | A1 | 7/2005 | Maa et al. |
| 2005/0208740 | A1 | 9/2005 | Todd |
| 2005/0245049 | A1 | 11/2005 | Akatsu et al. |
| 2005/0247924 | A1 | 11/2005 | Atwater |
| 2005/0250302 | A1 | 11/2005 | Todd et al. |
| 2005/0272222 | A1 | 12/2005 | Flamand et al. |
| 2005/0275067 | A1 | 12/2005 | Atwater |
| 2006/0019464 | A1 | 1/2006 | Maa et al. |
| 2006/0021565 | A1 | 2/2006 | Zahler |
| 2006/0024435 | A1 | 2/2006 | Holunga |
| 2006/0030124 | A1 | 2/2006 | Maa et al. |
| 2006/0030131 | A1 | 2/2006 | Richardson |
| 2006/0060943 | A1 | 3/2006 | Mohamed et al. |
| 2006/0071213 | A1 | 4/2006 | Ma et al. |
| 2006/0088985 | A1 | 4/2006 | Haverkort et al. |
| 2006/0108688 | A1 | 5/2006 | Richardson |
| 2006/0112986 | A1 | 6/2006 | Atwater |

OTHER PUBLICATIONS

Ahn, et. al., Growth, Shrinkage, and Stability of Interfacial Oxide Layers Between Directly Bonded Silicon Wafers, Applied Physics A 50 (1990), pp. 85-94.

Huang et. al., The Lower Boundary of the Hydrogen Concentration required for Enhancing Oxygen Diffusion and Thermal Donor Formation in Czochralski Silicon, Journal of Applied Physics 98, 033511 (2005).

Ling et. al., Relationship Between Interfacial Native Oxide Thickness and Bonding Temperature in Directly Bonded Silicon Wafer Pairs, Journal of Applied Physics 71 (3), Feb. 1, 1992, pp. 1237-1241.

Yamazaki et. al., Influence of Annealing Ambient on Oxygen Out-Diffusion in Czochralski Silicon, Journal of Applied Physics, vol. 87, No. 9, May 1, 2000, pp. 4194-4197.

Agarwal, et. al., Efficient Production of Silicon-on-Insulator Films by Co-Implantation of the He+ with H+, Applied Physics, Mar. 2, 1998, Letters, vol. 72, No. 9.

Bennett et al., Complete Surface Exfoliation of 4H-SiC by H+- and Si+ Coimplantation, Applied Physics Letters, vol. 76, No. 22, May 29, 2000.

Brendel, A Novel Process for Ultrathin Monocrystalline Silicon Solar Cells on Glass, 14$^{th}$ European Photovoltaic Solar Energy Conference, Jun. 30 to Jul. 4, 1997, Barcelona, Spain.

Brendel, Crystalline Thin-film Silicon Solar Cells from Layer-Transfer Processes: A Review, Proc. 10$^{th}$ Workshop on Crystalline Silicon Solar Cell Materials and Processes, Aug. 13-16, 2000, Copper Mountain, USA, ed. by B.L. Sopori, (NREL, Golden, 2000).

Deboer, Low Temperature Epitaxial Silicon Growth Using Electron Cyclotron Resonance Plasma Deposition, Dissertation, Iowa State University, Ames, IA 1995.

Deboer et al., Preparation and Properties of High Quality Crystalline Silicon Films Grown by ECR Plasma Deposition, IEEE, Hawaii, Dec. 5-9, 1994.

De Moor, Technology Development for 3D Integration at IMEC "3D Architectures for Semiconductor Integration and Packaging", Tempe AZ Jun. 13-15, 2005.

Deng et. al., High Efficiency and High Rate Deposited Amorphous Silicon-Based Solar Cells, Phase II, Annual Technical Progress Report, Sep. 1, 2002 to Aug. 31, 2003 NREL Subcontract No. NDY-2-30630-08.

Du et. al., Impact of Hydrogen dilution on Microstructure and Optoelectronic Properties of Silicon Films Deposited using Trisilane, J. Phys D: Appl. Phys. 38 (2005) pp. 838-842.

Duo et al., Comparison Between the Different Implantation Orders in H+ and He+ Coimplantation, Journal of Physics D: Applied Physics, 34, 477-482, 2001.

Ellis Jr., et. al., Chemical Vapor Deposition of Boron-Doped Hydrogenated Amorphous Silicon, App. Phys. Lett, 47 (2), Jul. 15, 1985, p. 135.

Feijoo et al., Prestressing of Bonded Wafers. Proceedings of the First International Symposium on Semiconductor Wafer Bonding: Science, Technology and Applications, The Electrochemical Society, vol. 92-7, New York, NY 1992.

Garrou, 3D Integration: A Status Report "3D Architectures for Semiconductor Integration and Packaging", Tempe AZ Jun. 13-15, 2005.

Gösele, Semiconductor Wafer Bonding: Science Technology and Applications, Electrochemical Society Proceedings, vol. 97-36, pp. 229-248, 1998.

Gui et al., The Effect of Surface Roughness on Direct Wafer Bonding, Journal of Applied Physics vol. 85, No. 10, May 15, 1999.

Gui et al., Selective Wafer Bonding by Surface Roughness Control, Journal of the Electrochemical Society, 148 (4), G225-228, 2001.

Henttinen et al., Cold Ion-Cutting of Hydrogen Implanted Si, Nuclear Instruments and Methods in Physics Research B, 190, 761-766, 2002.

Huff et. al. Silicon Materials Science and Technology, Electrochemical Society Proceedings vol. 98-1, pp. 1385-1394, 1998.

Hurley et al., Ion Implantation of Hydrogen and Helium into Silicon Wafers for Layer Transfer in Devices, Vacuum, 78, 167-175, 2005.

Joly, New Wafer to Wafer and Chip to Wafer Device Stacking Technology Implementations "3D Architectures for Semiconductor Integration and Packaging", Tempe AZ Jun. 13-15, 2005.

Kumata et. al., Photochemical Vapor Deposition of Hydrogenated Amorphous Silicon Films from Disilane and Trisilane using a Low Pressure Mercury Lamp, Appl. Phys. Lett 48 (20) May 19, 1986, p. 1380.

Lee et al., Strained Silicon Thin-Film Transistors Fabricated on Glass, Applied Physics Letters, 86, 103504, Feb. 2005.

Morrison et. al., Deposition of Amorphous and Micro-Crystalline Silicon using a Graphite Filament in the Hot Wire CVD Technique, J. Vac. Sci. Technol A19 (6), Nov./Dec. 2001, p. 2817.

Reber et. al., Progress in High-Temperature Silicon Epitaxy using the RTCVD160 Processor, presented at the 19$^{th}$ European Solar Energy Conference, Jun. 7-11, 2004, Paris.

Roth et. al., Kinetics of Solid Phase Epitaxy in Thick Amorphous Si Layers formed by MeV Ion Implantation, Appl. Phys. Lett 57 (13) Sep. 24, 1990, p. 1340.

Saraswat, 3-Dimensional ICs: Motivation, Performance Analysis and Technology "3D Architectures for Semiconductor Integration and Packaging", Tempe AZ Jun. 13-15, 2005.

Sarma et al., Silicon-on-Quartz for Low Power Electronic Applications, Proceedings 1994 IEEE International SOI Conference, Oct. 1994.

Shi et al., Characterization of Low-Temperature Processed Single-Crystalline Silicon Thin-Film Transistor on Glass, IEEE Electron Device Letters, vol. 24, No. 9, Sep. 2003.

Stradins et. al., Physics of Solid-Phase Epitaxy of Hydrogenated Amorphous Silicon for Thin Film Si Photovoltaics, Materials Research Society Spring Meeting, San Francisco, 2006.

Takagi et al., Wafer-Scale Room-Temperature Bonding Between Silicon and Ceramic Wafers by Means of Argon-Beam Surface Activation, IEEE, 2001.

Tong et al., Low Temperature Si Layer Splitting, Proceedings 1997 IEEE International SOI Conference, Oct. 1997.

Venezia et al., The Role of Implantation Damage in the Production of Silicon-On-Insulator Films by Co-Implantation of He+ and H+, Proceedings of the Eighth International Symposium on Silicon Materials Science and Technology, vol. 98-1, 1998.

Voltaix Currents, Responding to Trends in Solar, Voltaix Currents, Spring Newsletter, Apr. 2005.

Walker, 3D Packaging: Density, Design and Decisions "3D Architectures for Semiconductor Integration and Packaging", Tempe AZ Jun. 13-15, 2005.

Wang et. al, 17.8% P Type Heterojunction Silicon Solar Cells by HWCVD, National Renewable Energy Laboratory, Colorado, PowerPoint Presentation, Spring 2006.

Weldon et al., On The Mechanism of The Hydrogen-Induced Exfoliation of Silicon, J. Vac. Science Tech. B, 15(4), Jul./Aug. 1997.

Weldon et al., Mechanistic Studies of Silicon Wafer Bonding and Layer Exfoliation, Proceedings of the Fourth National Symposium on Semiconductor Wafer Bonding: Science, Technology, and Applications, vol. 97-36, 1998.

Weldon et al., Mechanism of Silicon Exfoliation Induced by Hydrogen/Helium co-Implantation, Applied Physics Letter, vol. 73, No. 25, Dec. 21, 1998.

B.N. Mukashev et al., *Hydrogen Implantation into Silicon: Infra-Red Absorption Spectra and Electrical Properties*, Institute of High Energy Physics, Academy of Sciences of the Kazakh SSR, Alma-Ata1; 91, 509 (1985).

Bourdelle, et al., Fabrication of Directly Bonded Si Substrates with Hybrid Crystal Orientation for Advanced Bulk CMOS Technology, ECS Transactions, 3 (4) 409-415 (2006).

Fournel, et al., Low Temperature Void Free Hydrophilic Or Hydrophobic Silicon Direct Bonding, ECS Transactions, 3 (6) 139-146 (2006).

* cited by examiner

Parameters
- Silicon Layer thickness ~ 2000 Å
- Argon Ambient, 1200 C treatment
- 50 Å interface layer, $SiO_{0.5}$ stochiometry

- Diffusion Law (oxygen in silicon)

Flux (atoms/cm² – sec) = $D_o(T) * [d\, C_S(T)/d\, Z]$ where $C_S(T)$ = solid solubility limit, $D_o(T)$ = Oxygen diffusion constant in silicon

- At 1200 C, $C_S(T) = 4.6\ E+17\ cm^{-3}$, $D_o(T) = 3.15\ E-10\ cm^2/sec$
  - Using surface concentration ~ 0, Flux = 7.24 E+12 O-atoms/cm²-sec

- Total O-Dose = [4.4 E+22 $cm^{-3}$/4] * 50 E-8 cm = 5.5 E+15 atoms/cm²

- Expected time to dissolution
  - Total O-dose/Flux = 5.5 E+15 atoms/cm² / 7.24 E+12 O-atoms/cm²-sec

- Time to dissolution = 760 seconds

Figure 8A

H60308-02
Twist-bonded (45 degrees)
(100) FZ layer rotated 45 degrees on (100) FZ base substrate
150mm
EPI-Smooth + H2 Anneal (1200°C/1hr)

H60203-05
Twist-bonded (45 degrees)
(100) Epi coated substrate on <100> DZ (Denuded Zone) Argon annealed base substrate
200mm
As-cleaved

H60203-04
Twist-bonded (45 degrees)
(100) CZ substrate on <100> DZ
(Denuded Zone) Argon annealed
base substrate
200mm

METHOD AND STRUCTURE FOR FABRICATING BONDED SUBSTRATE STRUCTURES USING THERMAL PROCESSING TO REMOVE OXYGEN SPECIES

BACKGROUND OF THE INVENTION

The present invention relates to the manufacture of substrates. More particularly, the invention provides a technique including a method and a structure for forming multi-layered substrate structures using bonding techniques for the fabrication of semiconductor integrated circuit devices. Such bonding techniques include use of thermal processing to establish bonded interfaces that are substantially free of imperfections, defects, and/or other undesirable features according to a specific embodiment. In a preferred embodiment, the thermal processing causes oxygen species to be transferred from an interface region between a bonded pair to be removed to an outer region. But it will be recognized that the invention has a wider range of applicability; it can also be applied to other types of substrates for three-dimensional packaging of integrated semiconductor devices, photonic devices, piezoelectronic devices, flat panel displays, microelectromechanical systems ("MEMS"), nano-technology structures, sensors, actuators, solar cells, biological and biomedical devices, and the like.

From the very early days, human beings have been building useful articles, tools, or devices using less useful materials for numerous years. In some cases, articles are assembled by way of smaller elements or building blocks. Alternatively, less useful articles are separated into smaller pieces to improve their utility. A common example of these articles to be separated include substrate structures, such as a glass plate, a diamond, a semiconductor substrate, a flat panel display, and others. These substrate structures are often cleaved or separated using a variety of techniques. In some cases, the substrates can be separated using a saw operation. The saw operation generally relies upon a rotating blade or tool, which cuts through the substrate material to separate the substrate material into two pieces. This technique, however, is often extremely "rough" and cannot generally be used for providing precision separations in the substrate for the manufacture of fine tools and assemblies. Additionally, the saw operation often has difficulty separating or cutting extremely hard and or brittle materials, such as diamond or glass. The saw operation also cannot be used effectively for the manufacture of microelectronic devices, including integrated circuit devices, and the like.

Accordingly, techniques have been developed to fabricate microelectronic devices, commonly called semiconductor integrated circuits. Such integrated circuits are often developed using a technique called the "planar process" developed in the early days of semiconductor manufacturing. An example of one of the early semiconductor techniques is described in U.S. Pat. No. 2,981,877, in the name of Robert Noyce, who has been recognized as one of the fathers of the integrated circuit. Such integrated circuits have evolved from a handful of electronic elements into millions and even billions of components fabricated on a small slice of silicon material. Such integrated circuits have been incorporated into and control many of today's devices, such as computers, cellular phones, toys, automobiles, and all types of medical equipment.

Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits. Increasing circuit density has not only improved the complexity and performance of integrated circuits but has also provided lower cost parts to the consumer.

Making devices smaller is very challenging, as each process used in integrated circuit fabrication has a limit. That is to say, a given process typically only works down to a certain feature size, and then either the process or the device layout needs to be changed. Additionally, as devices require faster and faster designs, process limitations exist with certain conventional processes and materials. An example of such a process is an ability to make the thickness of the substrate thin after the manufacture of the integrated circuit devices thereon. A conventional process often used to thin these device layers is often called "back grinding," which is often cumbersome, prone to cause device failures, and can only thin the device layer to a certain thickness. Although there have been significant improvements, such back grinding processes still have many limitations.

Accordingly, certain techniques have been developed to cleave a thin film of crystalline material from a larger donor substrate portion. These techniques are commonly known as "layer transfer" processes. Such layer transfer processes have been useful in the manufacture of specialized substrate structures, such as silicon on insulator or display substrates. As merely an example, a pioneering technique was developed by Francois J. Henley and Nathan Chung to cleave films of materials. Such technique has been described in U.S. Pat. No. 6,013,563 titled Controlled Cleaving Process, assigned to Silicon Genesis Corporation of San Jose, Calif., and hereby incorporated by reference for all purposes. Although such technique has been successful, there is still a desire for improved ways of manufacturing multilayered structures.

From the above, it is seen that a technique for manufacturing large substrates which is cost effective and efficient is desirable.

BRIEF SUMMARY OF THE INVENTION

According to the present invention, techniques related to the manufacture of substrates are provided. More particularly, the invention provides a technique including a method and a structure for forming multi-layered substrate structures using bonding techniques for the fabrication of semiconductor integrated circuit devices. Such bonding techniques include use of thermal processing to establish bonded interfaces that are substantially free of imperfections, defects, and/or other undesirable features according to a specific embodiment. In a preferred embodiment, the thermal processing causes oxygen species to be transferred from an interface region between a bonded pair to be removed to an outer region. But it will be recognized that the invention has a wider range of applicability; it can also be applied to other types of substrates for three-dimensional packaging of integrated semiconductor devices, photonic devices, piezoelectronic devices, flat panel displays, microelectromechanical systems ("MEMS"), nano-technology structures, sensors, actuators, solar cells, biological and biomedical devices, and the like.

In a specific embodiment, the present invention provides a method for fabricating bonded substrate structures, e.g., silicon on silicon. In a specific embodiment, the method includes providing a thickness of single crystal silicon material transferred from a first silicon substrate coupled to a second silicon substrate. In a specific embodiment, the second silicon substrate has a second surface region that is joined to a first surface region from the thickness of single crystal silicon material to form of an interface region having a first characteristic including a silicon oxide material between the thickness of single crystal silicon material and the second silicon substrate. The method includes subjecting the interface region to a thermal process to cause a change to the interface region from the first characteristic to a second characteristic. In a specific embodiment, the second characteristic is free from the silicon oxide material and is an epitaxially formed silicon material provided between the thickness of single crystal silicon material and the second silicon substrate. Optionally, the method includes maintaining the interface region free of multiple voids during the thermal process to form the epitaxial silicon material to electrically couple and/or improve and/or prefect the electrical coupling between the thickness of single crystal silicon material to the second silicon substrate. It should be noted that the term "interface" or "interface region" should not be construed to be limited but has been used as interpreted by one of ordinary skill in the art. As merely an example, the term interface can define a region between any two regions according to a specific embodiment.

In an alternative specific embodiment, the present invention provides a silicon on silicon substrate structure, e.g., direct silicon bonded structure. The structure has a first silicon substrate (e.g., silicon wafer) having a first surface region. A thickness of single crystal semiconductor material layer is transferred overlying the first surface region. In a preferred embodiment, the thickness of single crystal semiconductor material has a thickness of about 1 micron and less and has a second surface region facing the first surface region of the first silicon substrate. The structure has an epitaxially formed interface region provided between the first surface region and the second surface region. The structure also has one to five mono-layers of atoms characterizing the epitaxially formed interface region to electrically couple the first silicon substrate to the thickness of single crystal semiconductor material.

In yet a further alternative embodiment, the present invention provides a method for fabricating bonded substrate structures, e.g., silicon on silicon. The method includes providing a thickness of single crystal silicon material transferred from a first silicon substrate coupled to a second silicon substrate. The second silicon substrate has a second surface region that is joined to a first surface region from the thickness of single crystal silicon material to form of an interface region having a first characteristic including a silicon oxide material between the thickness of single crystal silicon material and the second silicon substrate. In a preferred embodiment, the thickness of single crystal silicon includes a surface region having a plurality of trapping sites, e.g., surface roughness. The method includes subjecting the interface region (and/or entire substrates structure) to a thermal process to cause a change to the interface region from the first characteristic to a second characteristic to electrically couple the thickness of single crystal silicon material to the second silicon substrate. The second characteristic is free from the silicon oxide material and is an epitaxially formed silicon material provided between the thickness of single crystal silicon material and the second silicon substrate. The thermal treatment also causes a portion of the silicon oxide material to be transferred to one or more trapping sites provided on the surface region. Optionally, the silicon oxide material provided on the one or more trapping sites are selectively removed using a selective etchant (e.g., HF, BOE) and/or chemical mechanical polishing process. Of course, there can be other variations, modifications, and alternatives.

Numerous benefits are achieved over pre-existing techniques using the present invention. In particular, the present invention uses controlled energy and selected conditions to preferentially cleave and treat a thin film of material without a possibility of damage to such film from excessive energy release and/or thermal energy. This cleaving process selectively removes the thin film of material from the substrate while preventing a possibility of damage to the film or a remaining portion of the substrate. Additionally, the present method and structures allow for more efficient processing using a cleave layer provided in a substrate through the course of semiconductor processing, which may occur at higher temperatures, according to a specific embodiment. In a specific embodiment, the cleaved film, which is attached to a handle substrate, is subjected to a rapid thermal treatment process to firmly engage the cleaved film to the handle substrate without formation of imperfections within a vicinity of an interface region provided between the cleaved film and substrate. In a specific embodiment, the cleaved assembly can be subjected to a smoothing process as taught in U.S. Pat. No. 6,287,941 issued Sep. 11, 2001, and in the names of Kang, Sien G. and Malik, Igor J., commonly assigned (the '941 patent), or U.S. Pat. Nos. 6,884,696 and 6,962,858, each of which is incorporated by reference herein to prepare a clean and defect-free surface and followed by a single-wafer reactor or furnace anneal operation to effectuate the oxygen dissolution. In the case of the epi-smoothing in the '941 patent process, for example, additional cost benefits can be realized by combining the anneal as an additional treatment in-situ to the prior epi-smoothing process sequence. Depending upon the embodiment, one or more of these benefits may be achieved. These and other benefits may be described throughout the present specification and more particularly below.

The present invention achieves these benefits and others in the context of known process technology. As an example, an application of this silicon-to-silicon bonded structure can be used where one or more layers are of differing crystal orientations. For example, the base substrate can be silicon (100) orientation and the top transferred film can be silicon (110) orientation. Alternatively, the base substrate can be (110) orientation and the transferred film can be (100) orientation. Other combinations of orientation including (111) orientation with any of the above can also be included according to an embodiment of the present invention. In a specific embodiment, the multi-layer structure can also be formed onto an SOI (i.e., silicon-on-insulator) structure where the top two films are of differing orientation and mounted onto a oxide-coated base substrate. Alternatively, one or more layers may be include global or localized strain or any combination of these, and the like. However, a further understanding of the nature and advantages of the present invention may be realized by reference to the latter portions of the specification and attached drawings.

BRIEF DESCRIPTION OF THE DRAWINGS

FIGS. 2 through 8, 8A, 8B, and 9 illustrate a simplified method for manufacturing a bonded substrate structure using a layer transferred substrate according to embodiments of the present invention.

DETAILED DESCRIPTION OF THE INVENTION

According to the present invention, techniques related to the manufacture of substrates are provided. More particularly, the invention provides a technique including a method and a structure for forming multi-layered substrate structures using bonding techniques for the fabrication of semiconductor integrated circuit devices. Such bonding techniques include use of thermal processing to establish bonded interfaces that are substantially free of imperfections, defects, and/or other undesirable features according to a specific embodiment. In a preferred embodiment, the thermal processing causes oxygen species to be transferred from an interface region between a bonded pair to be removed to an outer region. But it will be recognized that the invention has a wider range of applicability; it can also be applied to other types of substrates for three-dimensional packaging of integrated semiconductor devices, photonic devices, piezoelectronic devices, flat panel displays, microelectromechanical systems ("MEMS"), nano-technology structures, sensors, actuators, solar cells, biological and biomedical devices, and the like.

Figure 1:
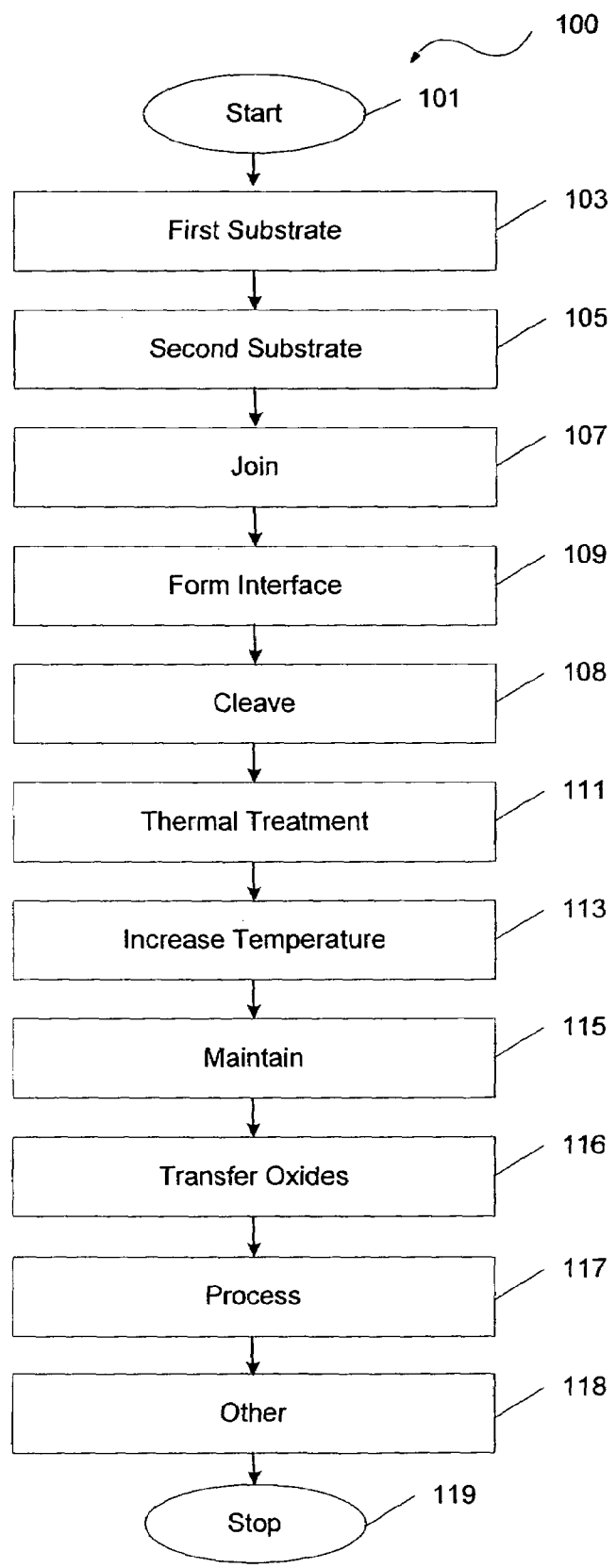
FIG. 1 illustrates an overall simplified method of forming silicon on silicon substrates according to embodiments of the present invention.
Figure 2:
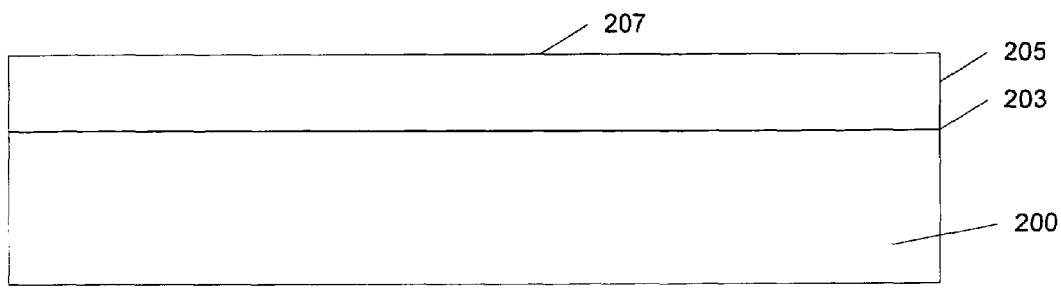

Referring to FIG. 1, a method 100 for joining substrates together to form a silicon on silicon bond according to embodiments of the present invention may be outlined as follows:

1. Begin process at start, step 101;
2. Provide a first silicon substrate (step 103), which has a first surface region, a cleave region, and a thickness of material to be removed between the first surface region and the cleave region;
3. Provide a second silicon substrate (step 105), which has a second surface region;
4. Join (step 107) the first surface region of the first silicon substrate to the second surface region of the second silicon substrate;
5. Form (step 109) of an interface region having a first characteristic including an oxide species between the first silicon substrate and the second silicon substrate (depending upon the embodiment, the forming of the interface can occur simultaneously and/or along with and/or after the joining process, step 107);
6. Cleave (step 108) the thickness of material from the first silicon substrate, while the second silicon substrate remains attached to the thickness of material;
7. Subject the interface region (including the first and second silicon substrates in a specific embodiment) to a thermal process, step 111, to increase in temperature from at least a first temperature within a first temperature range to at least a second temperature within a second temperature range (step 113) to form a second characteristic at the interface region;
8. Maintain (step 115) the interface region substantially free from one or more voids of a dimension of about 10 microns and greater;
9. Cause transfer (step 116) of the oxide species from the interface region to an outer region to form a substantially crystalline silicon material at the interface region;
10. Process (step 117) at least a portion of one of the substrates using one or more processes to form at least one integrated circuit device onto the portion of the one of the substrates;
11. Perform other steps (step 118), as desired; and
12. Conclude process at stop, step 119;

The above sequence of steps provides a method according to an embodiment of the present invention. As shown, the method uses a combination of steps including a way of forming a silicon on silicon bonded structure according to an embodiment of the present invention. In a preferred embodiment, the method uses a thermal process to secure the bond while preventing formation from one or more voids at the interface region. In a preferred embodiment, the method uses a thermal treatment to cause transfer and/or diffusion of oxide species from the interface region between the bonded pair to form a substantially crystalline silicon structure at the interface region. Other alternatives can also be provided where steps are added, one or more steps are removed, or one or more steps are provided in a different sequence without departing from the scope of the claims herein. Further details of the present method can be found throughout the present specification and more particularly below.

FIGS. 2 through 10 illustrate a simplified method for manufacturing integrated circuits on a layer transferred substrate according to embodiments of the present invention. These diagrams are merely illustrations that should not unduly limit the scope of the claims herein. One of ordinary skill in the art would recognize other variations, modifications, and alternatives. As shown, the method includes providing a semiconductor substrate 200, e.g., silicon, germanium, a silicon-germanium alloy, gallium arsenide, any Group III/V materials, and others. In a specific embodiment, the semiconductor substrate can be made of a single homogenous material, or a combination of various layers, depending upon the specific embodiment. Of course, there can be other variations, modifications, and alternatives.

In a preferred embodiment, the substrate 200 has a thickness of semiconductor material 205 and a surface region 207. In a specific embodiment, the substrate also has a cleave plane 203 (including a plurality of particles, deposited material, or any combination of these, and the like) provided within the substrate, which defines the thickness of semiconductor material. In a specific embodiment, the thickness of semiconductor material is crystalline silicon (e.g., single crystal silicon), which can include an overlying epitaxial silicon layer. In a specific embodiment, the silicon surface region 207 can have a thin layer of oxide such as silicon dioxide. The silicon dioxide has a thickness of 5 nm and less according to a specific embodiment. Depending upon the embodiment, the silicon oxide can be silicon dioxide, silicon oxide, silicon rich oxide, or any SiOx species, combinations thereof, and the like. Of course, there can be other variations, modifications, and alternatives.

Depending upon the embodiment, the cleave region can be formed using a variety of techniques. That is, the cleave region can be formed using any suitable combination of implanted particles, deposited layers, diffused materials, patterned regions, and other techniques. In a specific embodiment, the method introduces certain energetic particles using an implant process through a top surface of the semiconductor substrate, which can be termed a donor substrate, to a selected depth, which defines the thickness of the semiconductor material region, termed the "thin film" of material. A variety of techniques can be used to implant the energetic particles into a single crystal silicon wafer according to a specific embodiment. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other non-mass specific techniques (e.g., complete mass separate, partial mass separate) can be particularly effective for larger surface regions according to a specific embodiment. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about 1E15 to about 1E18 atoms/cm2, and preferably the dose is greater than about 1E16 atoms/cm2. Implantation energy ranges from about 1 KeV to about 1 MeV, and is generally about 50 KeV. Implantation temperature ranges from about −20 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. Of course, there can be other variations, modifications, and alternatives.

Depending upon the embodiment, there may be other techniques for forming a cleave region and/or cleave layer. As merely an example, such cleave region is formed using other processes, such as those using a silicon-germanium cleave plane developed by Silicon Genesis Corporation of Santa Clara, Calif. and processes such as the SmartCut™ process of Soitec SA of France, and the Eltran™ process of Canon Inc. of Tokyo, Japan, any like processes, and others. In a specific embodiment, the cleave region can include a strained/stressed region or be substantially free of strain/stress according to a specific embodiment. The cleave region can also include a deposited region with or without an implanted region according to a specific embodiment. Of course, there may be other variations, modifications, and alternatives.

Figure 3:
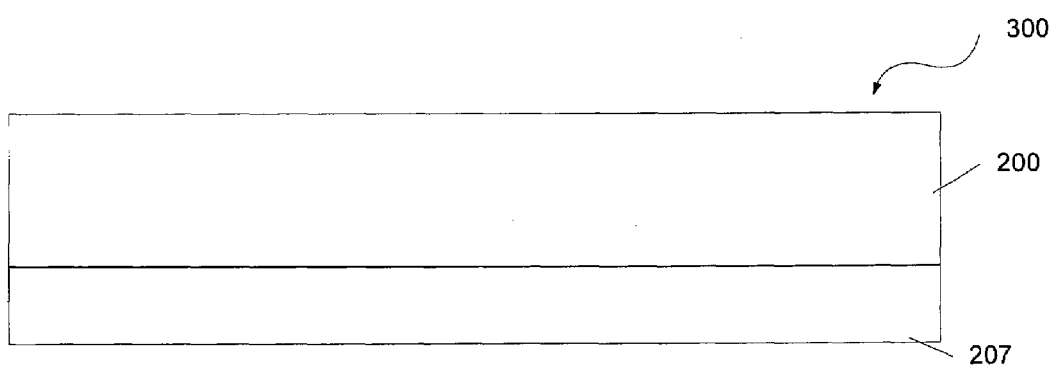
Figure 3:
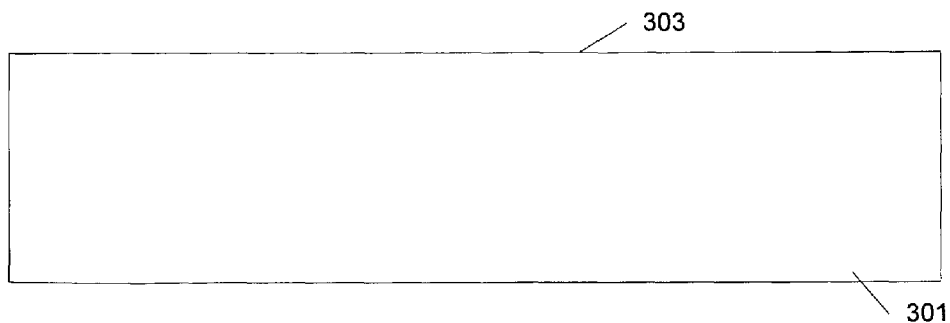

Referring now to FIG. 3, the method includes joining 300 the surface region of the semiconductor substrate to a first handle substrate 301. In a specific embodiment, the handle substrate is made of a suitable material that is also substantially crystalline, e.g., single crystal silicon. That is, the handle substrate can be made of a silicon wafer, an epitaxial silicon wafer, denuded zone wafers (e.g., hydrogen annealed, argon annealed, a MDZ™ Product by MEMC Electronic Materials, Inc.) or other crystalline materials (including layer transferred silicon on insulator substrates) according to a specific embodiment. Depending upon the embodiment, the handle substrate can be doped (e.g., P-type, N-type) and/or undoped, including nitrogen doped substrates and the like. Of course, there can be other handle substrate material. In a preferred embodiment, the silicon wafer has a silicon surface region 301. In a specific embodiment, the silicon surface region can have a thin layer of oxide such as silicon dioxide. The silicon dioxide has a thickness of 5 nm and less according to a specific embodiment. Depending upon the embodiment, the silicon oxide can be silicon dioxide, silicon oxide, silicon rich oxide, or any SiOx species, combinations thereof, and the like. Of course, there can be other variations, modifications, and alternatives.

In a preferred embodiment, the first handle substrate has a surface region 305, which will be joined and/or bonded with surface region 207 provided on substrate 200. Like reference numerals are used in this figure has others, but are not intended to be limiting the scope of the claims herein. Further details of the joining process can be found throughout the present specification and more particularly below.

Before joining, the semiconductor substrate and the first handle substrate surfaces are each subjected to a cleaning solution to treat the surfaces of the substrates to clean the substrate surface regions according to a specific embodiment. An example of a solution used to clean the substrate and handle surfaces is a mixture of hydrogen peroxide and sulfuric acid, and other like solutions. A dryer dries the semiconductor substrate and handle surfaces to remove any residual liquids and/or particles from the substrate surfaces. Self-bonding occurs by placing surfaces of cleaned substrates (e.g., semiconductor substrate surface and handle substrate surface) together after an optional plasma activation process depending on the specific layer-transfer process used. If desired, such plasma activated processes clean and/or activate the surfaces of the substrates. The plasma activated processes are provided, for example, using an oxygen or nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Thereafter, each of these substrates is bonded together according to a specific embodiment. As shown, the handle substrate has been bonded to the donor substrate surface region. The substrates are preferably bonded using an EVG 850 bonding tool manufactured by Electronic Vision Group or other like processes for smaller substrate sizes such as 200 mm or 300 mm diameter wafers. Other types of tools such as those manufactured by Karl Suss may also be used. Of course, there can be other variations, modifications, and alternatives.

Preferably, bonding between the handle substrate and the donor is substantially permanent and has good reliability.

Accordingly after bonding, the bonded substrate structures are subjected to a bake treatment according to a specific embodiment. The bake treatment maintains the bonded substrate at a predetermined temperature and predetermined time. Preferably, the temperature ranges from about 200 or 250 Degrees Celsius to about 400 Degrees Celsius and is preferably about 350 Degrees Celsius for about 1 hour or so for a silicon donor substrate and the first handle substrate to attach themselves to each other permanently according to the preferred embodiment. In a specific embodiment, the bake treatment can occur using a furnace, a rapid thermal process, or a hot plate or any combination of these. Depending upon the specific application, there can be other variations, modifications, and alternatives.

In a specific embodiment, the substrates are joined or fused together using a low temperature thermal step. The low temperature thermal process generally ensures that the implanted particles do not place excessive stress on the material region, which can produce an uncontrolled cleave action. In a specific embodiment, the low temperature bonding process occurs by a self-bonding process.

Alternatively, an adhesive disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250.degree. C.) often needed to cure the SOG after it is applied to surfaces of the wafers.

Alternatively, a variety of other low temperature techniques can be used to join the donor substrate surface regions to the handle substrate. For instance, an electrostatic bonding technique can be used to join the two substrates together. In particular, one or both substrate surface(s) is charged to attract to the other substrate surface. Additionally, the donor substrate surface can be fused to the handle wafer using a variety of other commonly known techniques. Of course, the technique used depends upon the application.

Figure 4:
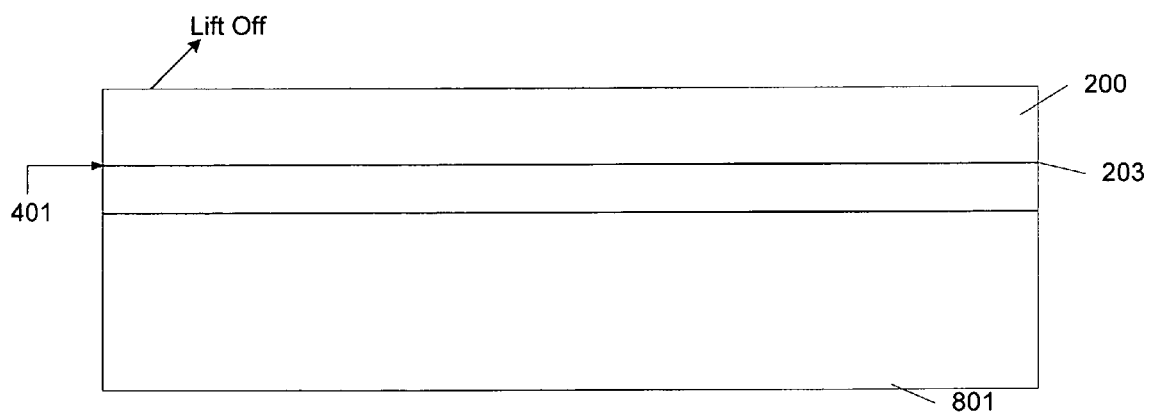

Referring to FIG. 4, the method includes initiating a controlled cleaving action using energy 401 provided at a selected portion of the cleave plane to detach the thickness of semiconductor material from the substrate, while the thickness of semiconductor material remains joined to the first handle substrate. Depending upon the specific embodiment, there can be certain variations. For example, the cleaving process can be a controlled cleaving process using a propagating cleave front to selectively free the thickness of material from the donor substrate attached to the handle substrate. Alternative techniques for cleaving can also be used. Such techniques, include, but are not limited to those called a Nanocleave™ process of Silicon Genesis Corporation of Santa Clara, Calif., a SmartCut™ process of Soitec SA of France, and an Eltran™ process of Canon Inc. of Tokyo, Japan, any like processes, and others. The method then removes the remaining portion of the semiconductor donor substrate, which provided the thickness of material to the handle substrate according to a specific embodiment.

Figure 5:
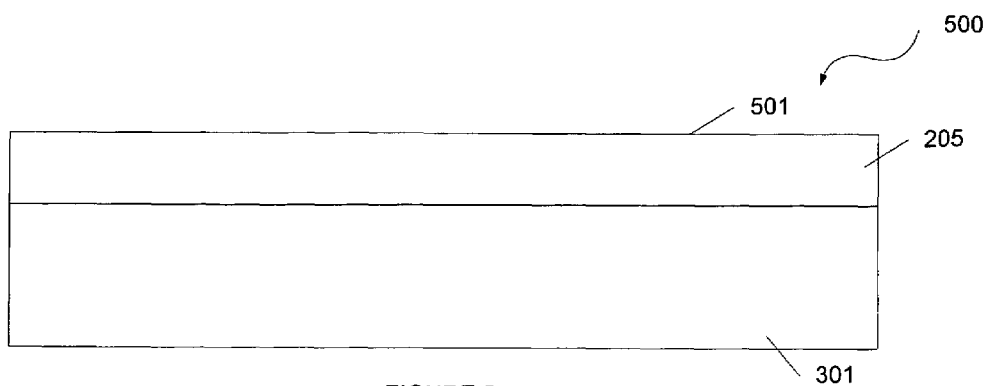

Referring to FIG. 5, the method provides a resulting handle substrate 500 including an overlying thickness of material 205 according to a preferred embodiment. In a specific embodiment, the thickness of material is provided on the handle substrate using a silicon on silicon bond, which provides electrical coupling between the two structures. As shown, the thickness of material includes a cleaved surface region 501. The bonded substrate structure is bonded together, but not suitable for integrated circuit processing. That is, the bonded substrate structure should be subjected to a permanent bond using at least a rapid thermal technique and/or furnace anneal, which will be described in more detail throughout the present specification and more particularly below. Of course, there can be other variations, modifications, and alternatives.

Figure 6:
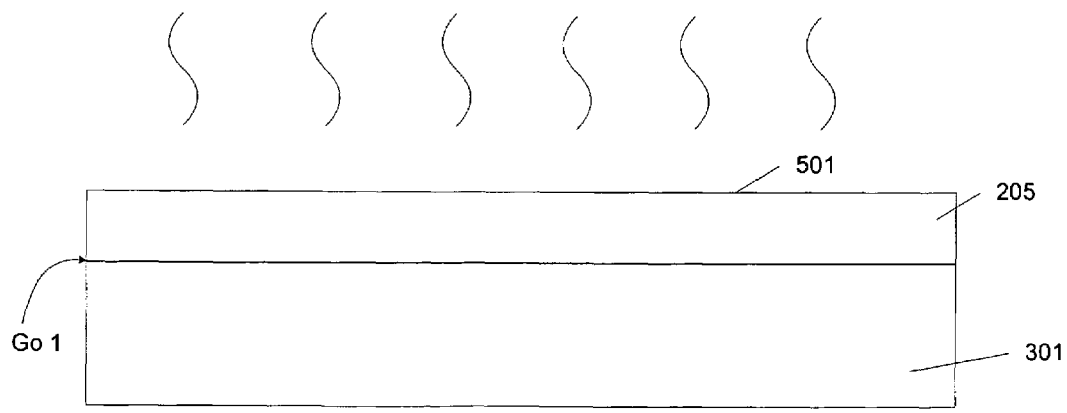

Referring now to FIG. 6, the present method includes subjecting an interface region 601 to a thermal process to cause an increase in temperature from at least a first temperature within a first temperature range of about 100 Degrees Celsius to about 200 Degrees Celsius to at least a second temperature within a second temperature range of about 800 Degrees Celsius and greater. In a preferred embodiment, the thermal process causes the increase in temperature from the first temperature to at least the second temperature within a time period of about 2 seconds and less to form a second characteristic at the interface region. In a specific embodiment, the time period can be less than one second. Depending upon the embodiment, the thermal process can be a suitable rapid thermal process, rapid thermal anneal, rapid thermal process using laser irradiation, or the like. In a specific embodiment, the thermal process comprises irradiating the thickness of material and silicon handle substrate using a monochromatic light source. Further details of the irradiation technique can be found throughout the present specification and more particularly below.

In a specific embodiment, the irradiation can occur in a suitable processing tool. The processing tool can include a chamber of a cluster tool or suitable stand alone tool or the like. Depending upon the embodiment, the cluster tool can also include other chambers for implantation, controlled cleaving, bonding, and other process technologies. In a specific embodiment, the irradiation can occur using an increase in temperature with a suitable increase from an initial temperature to a final temperature. Such increase in temperature can be at a rate of about 1000 Degrees Celsius per minute and greater or include step increases or other variations according to a specific embodiment. Of course, there can be other variations, modifications, and alternatives.

In a preferred embodiment, the present method maintains the interface region substantially free from one or more voids of a dimension of about 10 microns and greater. In a specific embodiment, the method preferably maintains the interface region free from any and all voids, which can cause reliability and/or processing limitations. These voids may be caused by a plurality of hydrogen species that have been introduced into the cleave region in a preceding process according to a specific embodiment. Depending upon the embodiment, the thermal processing secures bonding between the thickness of material while preventing accumulation of hydrogen species by diffusion, which can be characterized by a hydrogen diffusion characteristic in the thickness of material. Other impurities that may accumulate at the interface through diffusion include water, hydroxide species, carbon containing species, and others according to a specific embodiment.

In a preferred embodiment, the interface region is subjected to a high temperature thermal treatment process that substantially frees the interface region from oxide species. Depending upon the embodiment, the process can include or more rapid thermal and/or furnace annealing techniques. That is, the bond between the thickness of silicon material and silicon substrate is free from silicon dioxide or other oxides according to a specific embodiment. The interface preferably electrically couples the thickness of material to the silicon substrate according to a specific embodiment. Depending upon the embodiment, the interface can also have a very thin oxide layer, which is about 10 nm and less. Such thin oxide layer causes certain resistance between the thickness of silicon material and silicon substrate according to a specific embodiment. The resistivity is less than about 10 times a resistivity of the surrounding bulk substrates (e.g., crystalline silicon) according to a specific embodiment. Of course, there can be other variations, modifications, and alternatives.

In a more preferred embodiment, the thermal treatment is provided using an inert gas or reducing gas maintained on the silicon on silicon substrate member. In a specific embodiment, the gas is substantially free from any oxide species. The thermal treatment includes subjecting the interface region to a thermal process to cause a change to the interface region from the first characteristic to a second characteristic, which is free from the silicon oxide material and where an epitaxial silicon material is formed by epitaxial regrowth provided between the thickness of single crystal silicon material and the handle silicon substrate. In a preferred embodiment, the method also maintains the interface region free of multiple voids during the thermal process to form the epitaxial silicon material to electrically couple the thickness of single crystal silicon material to the handle silicon substrate. In a specific embodiment, the epitaxial growth is predominantly or substantially single crystal in characterisitic. Of course, there can be other variations, modifications, and alternatives.

In a specific embodiment, the thermal process comprises subjects the joined thickness of single crystal silicon material and the handle substrate to an argon, hydrogen, or argon-hydrogen bearing environment at a temperature greater than about 1000 Degrees Celsius, although it can be slightly below depending upon the embodiment. Other types of combinations including argon, hydrogen, nitrogen, or the like can also be used according to a specific embodiment of the present invention. The thermal processes causes oxygen species in the interface region to diffuse out from the interface region, through one or more portions of the substrate member according to a specific embodiment. In a preferred embodiment, the oxygen diffuses out of the bonded substrate members. The interface region changes in characteristic from an oxide material to a crystalline silicon material, which is more effective at electrically coupling the thickness of silicon material to the handle substrate. Of course, there can be other variations, modifications, and alternatives.

Figure 7:
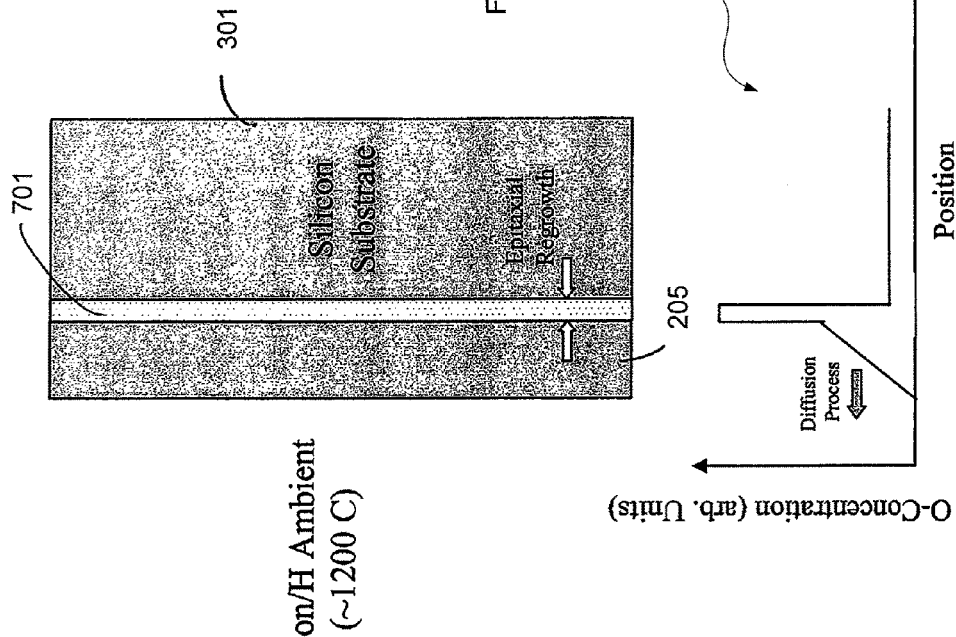

Referring to FIG. 7, an illustration of a silicon substrate 301 and an overlying thickness of silicon material 205 is shown. This diagram is merely an example, which should not unduly limit the scope of the claims herein. One of ordinary skill in the art would recognize many variations, modifications, and alternatives. Between the thickness of silicon material and silicon substrate is a thin oxide layer 701, which has been previously described. In a specific embodiment, the thin oxide layer has a concentration illustrated by plot 750. As shown, the vertical axis shows oxygen species concentration, which is provided against horizontal axis for spatial position. The spatial position is provided along the thickness from the surface region of the thickness of material to the backside of the silicon substrate, as shown. As shown, a high concentration of oxide material is illustrated at the interface region between the thickness of silicon material and silicon substrate. As the oxygen-rich interfacial layer is dissolved by the thermal treatment, an epitaxial regrowth of the silicon occurs that allows the interface to become of high crystalline quality and of high electrical conductivity.

Previous work by Goesele et al., "Growth, Shrinkage, and Stability of Interfacial Oxide Layers Between Directly Bonded Silicon Wafers", *Journal of Applied Physics*, A 50(1990), pp. 85-94; "Stability of Interfacial Oxide Layers During Silicon Wafer Bonding", *Journal of Applied Physics*, 65(2), 15 Jan. 1989, pp. 561-563; and Ling et al. "Relationship Between Interfacial Native Oxide Thickness and Bonding Temperature in Directly bonded Silicon Wafer Pairs", *Journal of Applied Physics;* 71 (3), 1 Feb. 1992, pp. 1237-1241, generally show that thermal annealing of bonded silicon wafers show dissolution behavior into float-zone silicon while CZ silicon would show a net interfacial oxide growth. In order to avoid developing defects and oxide dissolution spheroidization (uneven oxide thinning), rotated same-orientation films or the use of different crystal orientations are necessary. The work develops the concept of oxygen dissolution but its use in cleaved thin-film interface removal was not addressed.

Figure 8:
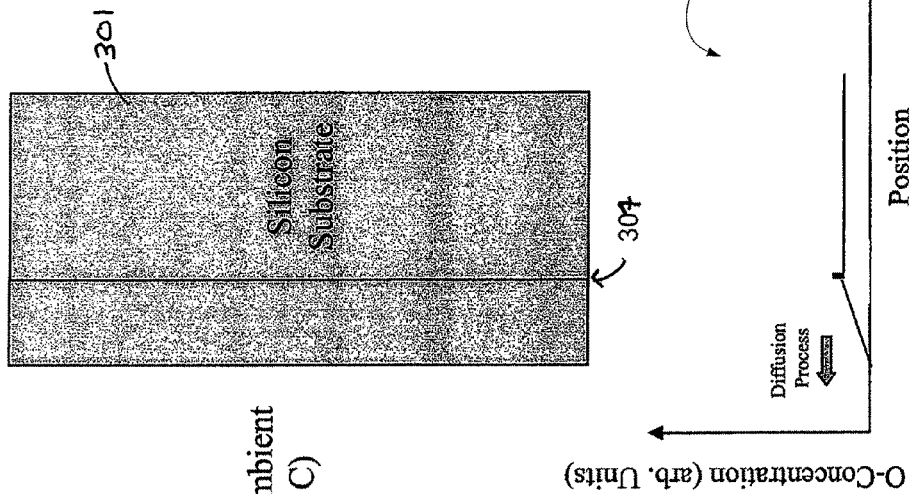

In a specific embodiment, the method subjects the thickness of silicon material and silicon substrate, including the interface region, to a thermal treatment, as illustrated by FIG. 8. This diagram is merely an example, which should not unduly limit the scope of the claims herein. One of ordinary skill in the art would recognize many variations, modifications, and alternatives. As shown, the high temperature anneal, which representatively includes an argon and/or hydrogen environment, drives out the oxide material from the substrate, as illustrated by plot 850 according to a specific embodiment. As shown, the interface region 801 is now crystalline epitaxial silicon material 307, which couples the thickness of material to the silicon substrate according to a specific embodiment. Of course, there can be other variations, modifications, and alternatives.

As an example, certain process details associated with this example has been calculated and are illustrated by way of FIG. 8A. In this example, an argon thermal treatment is used where the oxygen situated at the bond interface is moved through the surface by diffusion. The rate of diffusion is calculated by Fick's law of diffusion using the crystalline silicon oxygen diffusivity and solid solubility at 1200 C. For easy reading, Fick's law has also been reproduced below.

$$\text{Flux(in atoms/cm}^2 \text{ second)} = Do(T)(dC/dz)$$

where
C is the oxygen concentration;
Do(T) is an oxygen diffusivity coefficient in silicon.

Note that for purposes of the slope calculation, the oxygen concentration operating for purposes of diffusion would be the solid solubility limit Cs(T) at the interface boundary and zero at the crystal surface. The derivative would therefore simplify to Cs(T)/film thickness). As illustrated, the calculated flux of 7.24 E+12 Oxygen atoms per square centimeters per seconds would allow a 200 nanometers silicon film to release a 5 nanometer SiOx layer (x=0.5) of 5.5 E+15 Oxygen atoms per square centimeters within about 13 minutes. Of course, there can be other variations, modifications, and alternatives.

Figure 8B:
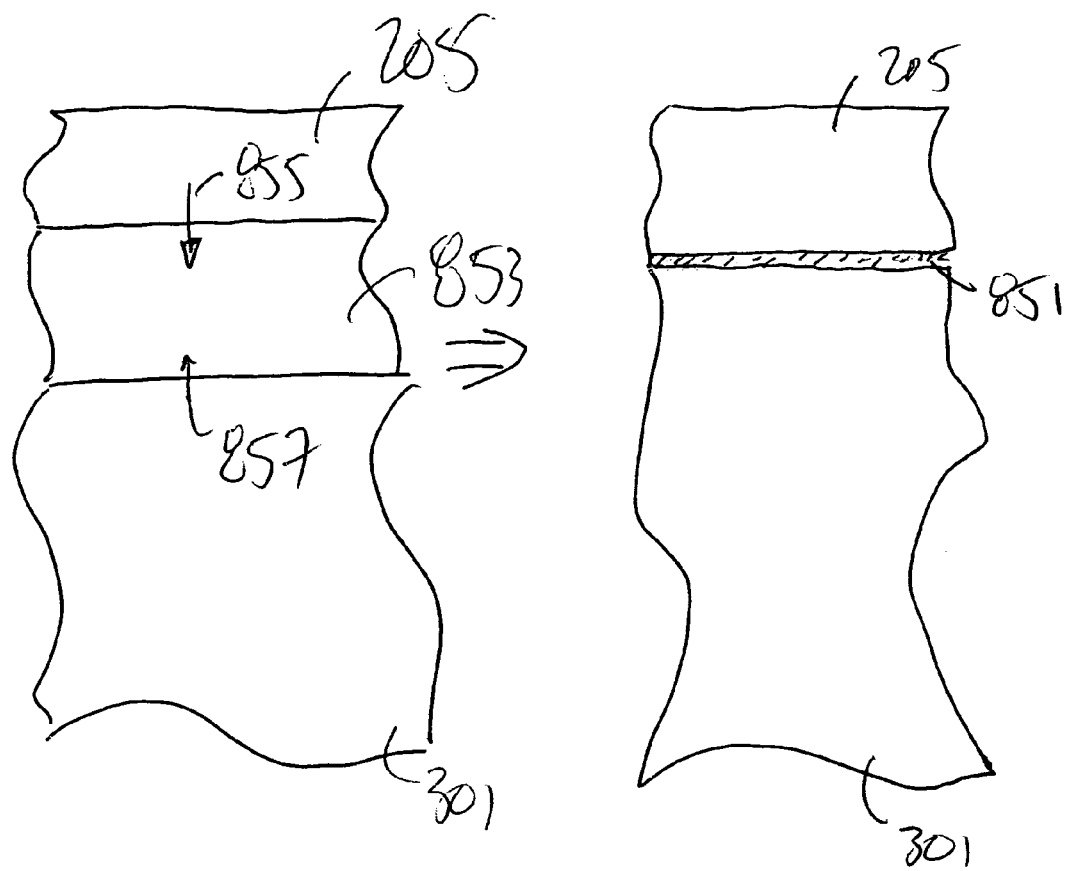

Referring now to FIG. 8B to further illustrate the epitaxially formed interface region, substrate 301, which has single crystal characteristics, is the handle substrate. In a specific embodiment, the handle substrate is a denuded silicon substrate that is substantially free from impurities such as oxygen precipitates, voids, cops, and other imperfections. In a specific embodiment, the oxygen concentration in the denuded substrate is about 0.5 to about 3E18 atoms/cm3 and less. Overlying the handle substrate is a thickness of single crystal material 205, which has been layer transferred onto the handle substrate. Between the thickness of single crystal material, which may be silicon, and handle substrate is a first oxide bearing interface region 853 according to a specific embodiment. In a specific embodiment, the first oxide bearing interface is derived by oxide material on either or both handle or thickness of material to facilitate bonding. In a specific embodiment, the first interface region has a first thickness that may be about 5 nanometers and less in a specific embodiment. Of course, there can be other variations, modifications, and alternatives.

Upon application of the present thermal treatment process, which converts the oxide material into single crystal silicon, according to a specific embodiment. The conversion occurs from each of the two interface regions (see arrows) toward a center region according to a specific embodiment. As these two regions converge, a resulting interface 851 forms, which is crystalline silicon that may have different crystal orientations. In a specific embodiment, the resulting interface has about one to five monolayers of silicon material, which electrically couple the thickness of material to the handle substrate. Depending upon the specific embodiment, the upper interface region 855 may move faster than the lower interface region 857 since the upper interface region has a thinner solid region 255 that facilitates diffusion of oxygen species from interface region 853, through the thickness of material to an outer region (outside the solid) according to a specific embodiment. Of course, there can be other variations, modifications, and alternatives.

In a specific embodiment, the resulting handle substrate has suitable characteristics for undergoing one or more processing steps. That is, the handle substrate can be subjected to conventional semiconductor processing techniques, including but not limited to, photolithography, etching, implanting, thermal annealing, chemical mechanical polishing, diffusion, deposition, and other others, which may be known by one of ordinary skill in the art. The handle substrate can also be selectively removed while transferring the thin film of material onto another substrate structure according to a specific embodiment.

Figure 9:
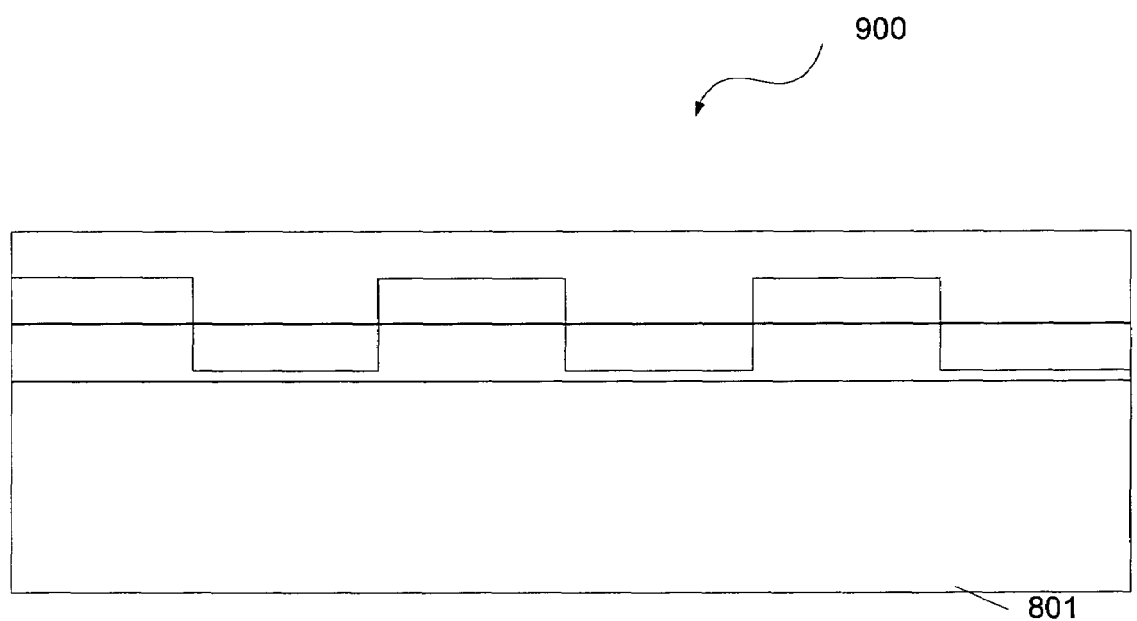

Referring to FIG. 9, the present method performs other processes on portions of the thickness of material regions, which have been attached to the handle substrate, according to a specific embodiment of the present invention. The method forms 900 one or more devices on one or more portions of the thin film of material overlying the handle substrate surface. Such devices can include integrated semiconductor devices, photonic and/or optoelectronic devices (e.g., light valves), piezoelectronic devices, microelectromechanical systems ("MEMS"), nano-technology structures, sensors, actuators, solar cells, flat panel display devices (e.g., LCD, AMLCD), biological and biomedical devices, and the like. Such devices can be made using deposition, etching, implantation, photo masking processes, any combination of these, and the like. Of course, there can be other variations, modifications, and alternatives. Additionally, other steps can also be formed, as desired.

In a preferred embodiment, the processing includes high temperature semiconductor processing techniques to form conventional integrated circuits thereon. The method forms a planarized surface region overlying the thickness of semiconductor material. In a specific embodiment, the planarized surface region can be formed using one or more suitable techniques. Such techniques include deposition of a dielectric layer, which is later reflowed using thermal treatment. The planarized surface region can also be formed using a chemical mechanical polishing process including a suitable slurry, pad, and process according to a specific embodiment. The planarized surface region can also be formed using any combination of these techniques and others according to a specific embodiment. The planarized surface region preferably has a uniformity of about 0.1% to about 5% end to end, and is within about 15 Angstroms RMS in roughness as measured on a 2 micron by 2 micron atomic-force microscope scan. Of course, there can be other variations, modifications, and alternatives.

Optionally, in a specific embodiment, the method also joins the planarized surface region of the resulting processed handle substrate to a face of a second handle substrate. Before joining, the processed thickness of material and the second handle substrate surfaces are each subjected to a cleaning solution to treat the surfaces of the substrates to clean the substrate surface regions according to a specific embodiment. An example of a solution used to clean the substrate and handle surfaces is a mixture of hydrogen peroxide and sulfuric acid, and other like solutions. A dryer dries the semiconductor substrate and handle surfaces to remove any residual liquids and/or particles from the substrate surfaces. Self-bonding occurs by placing surfaces of cleaned substrates (e.g., planarized region and handle substrate surface) together after an optional plasma activation process depending on the specific layer-transfer process used. If desired, such plasma activated processes clean and/or activate the surfaces of the processed substrates. The plasma activated processes are provided, for example, using an oxygen or nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Thereafter, each of these substrates (and processed devices) is bonded together according to a specific embodiment. As shown, the handle substrate has been bonded to the planarized surface region. The substrates are preferably bonded using an EVG 850 bonding tool manufactured by Electronic Vision Group or other like processes for smaller substrate sizes such as 200 mm or 300 mm diameter wafers. Other types of tools such as those manufactured by Karl Suss may also be used. Of course, there can be other variations, modifications, and alternatives. Preferably, bonding between the handle substrate and the planarized surface is substantially permanent and has good reliability.

Accordingly after bonding, the bonded substrate structures are subjected to a bake treatment according to a specific embodiment. The bake treatment maintains the bonded substrate at a predetermined temperature and predetermined time. Preferably, the temperature ranges from about 200 or 250 Degrees Celsius to about 400 Degrees Celsius and is preferably about 350 Degrees Celsius for about 1 hour or so for a planarized substrate region and the second handle substrate to attach themselves to each other permanently according to the preferred embodiment. Depending upon the specific application, there can be other variations, modifications, and alternatives.

In a specific embodiment, the substrates are joined or fused together using a low temperature thermal step. The low temperature thermal process generally ensures that the implanted particles do not place excessive stress on the material region, which can produce an uncontrolled cleave action. In a specific embodiment, the low temperature bonding process occurs by a self-bonding process.

Alternatively, an adhesive disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250.degree. C.) often needed to cure the SOG after it is applied to surfaces of the wafers.

Alternatively, a variety of other low temperature techniques can be used to join the substrate surface region to the handle substrate. For instance, an electro-static bonding technique can be used to join the two substrates together. In particular, one or both substrate surface(s) is charged to attract to the other substrate surface. Additionally, the donor substrate surface can be fused to the handle wafer using a variety of other commonly known techniques. Of course, the technique used depends upon the application.

While the above is a full description of the specific embodiments, various modifications, alternative constructions and equivalents may be used. Therefore, the above description and illustrations should not be taken as limiting the scope of the present invention which is defined by the appended claims. Further details of experiments performed using the present invention can be found throughout the present specification and more particularly below.

Experiment:

To prove the principle and operation of the present invention, we prepared certain experiments. These experiments are merely examples, which should not unduly limit the scope of the claims herein. One of ordinary skill in the art would recognize many variations, modifications and alternatives. These examples have been prepared and demonstrate the operation and method of the present invention. Details of these experiments can be found throughout the present specification and more particularly below.

We prepared a handle wafer sample using a (100) oriented wafer that is denuded zone argon annealed. A thin layer of silicon material was layer transferred to the handle substrate using a controlled cleaving process. The thin layer of silicon was (100) orientation single crystal silicon and denuded zone argon annealed and bonded with 45 degree rotation to eliminate spheroidization during the subsequent thermal processing. Joining the two materials together used plasma activation bonding. A thin layer of oxide was on each of the surface regions of the bonded substrates. The thin layer of material was provided using a hydrogen implanted silicon substrate. After cleaving, the cleaved surface is subjected to smoothing, which eliminates gettering sites, and other imperfections that may trap oxygen species. A hydrogen species was used to anneal the bonded and cleaved substrates at a temperature of about 1200 Degrees Celsius for a period of about 1 hour or so. As will be shown, oxygen species at the interface region were removed to form a silicon on silicon bonded structure according to an embodiment of the present invention. Of course, there can be other variations, modifications, and alternatives.

Figure 10:
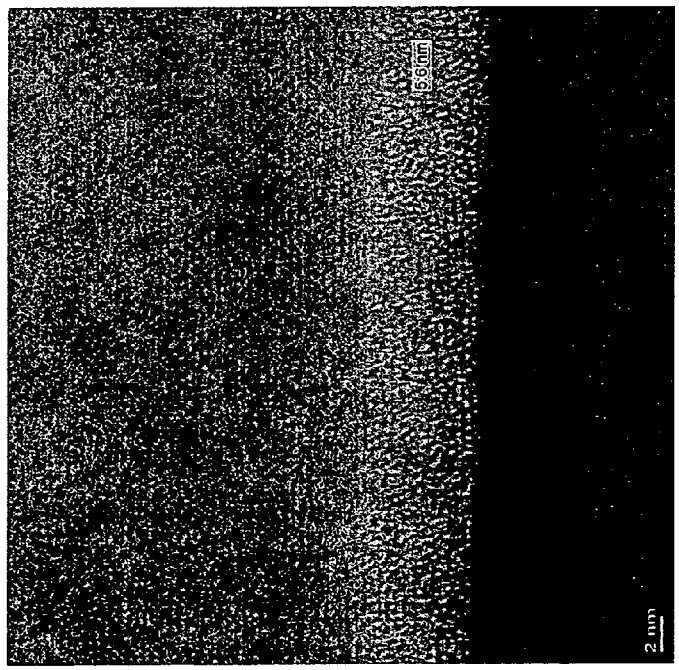

FIG. 10 shows a TEM (transmission electron micrograph) of an interfacial layer for a (100) silicon substrate plasma-bonded to an as-cleaved (100) film also bonded at 45 degrees. The as-cleaved film thickness was about 200 nanometers. The SiOx layer is clearly visible as a continuous layer of about 5.6 nm thickness across the two silicon internal surfaces. In this experiment, we annealed the cleaved substrate to reduce and/or eliminate the oxygen species at the interface between the bonded substrate regions. Further details of this can be found throughout the present example and more particularly below.

Figure 11:
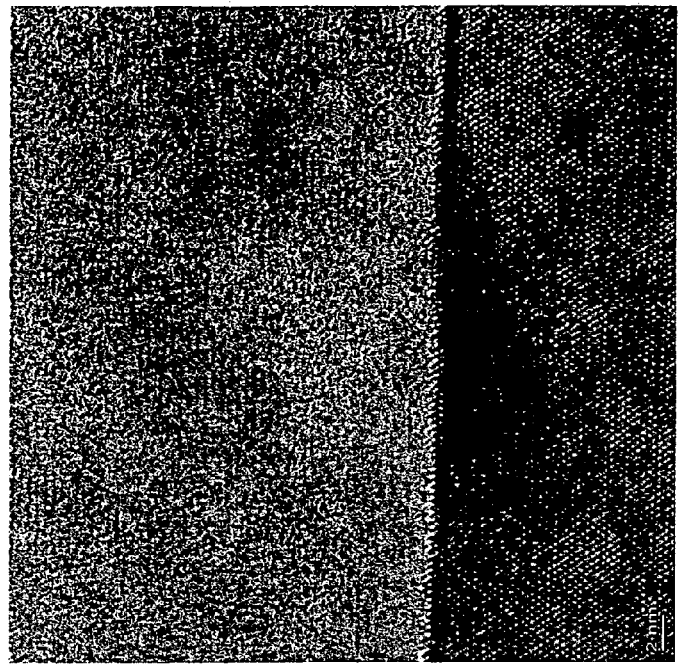
FIGS. 10-14 are illustrations according to experiments performed using embodiments of the present invention.

FIG. 11 shows a similar cleaved film subjected to the high-temperature anneal process according to an embodiment of the present invention. As shown, the interfacial oxide of about 5.5 nanometers has been dissolved after a smoothing process to remove about 90 nm of the silicon film followed by an in-situ hydrogen anneal of 1200 C for 1 hour. The smoothing process allows the surface to be free of getter or trapping sites that would impede the diffusion of the oxygen towards and through the surface. The cleaved and smoothed film has a surface roughness of about 1.5 Angstroms and less as measured by a 2 um×2 um AFM. The TEM in FIG. 11 shows that the interfacial oxide has been completely eliminated and the crystalline structure shows that solid phase epitaxial regrowth of the interface silicon occurred.

Figure 13:
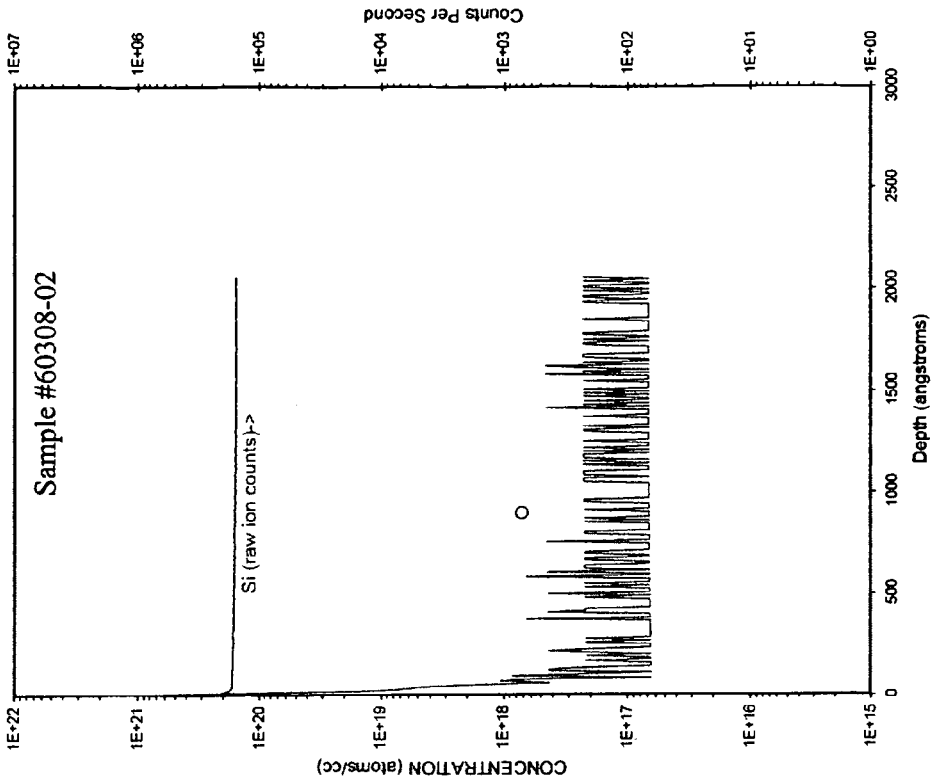
Figure 12:
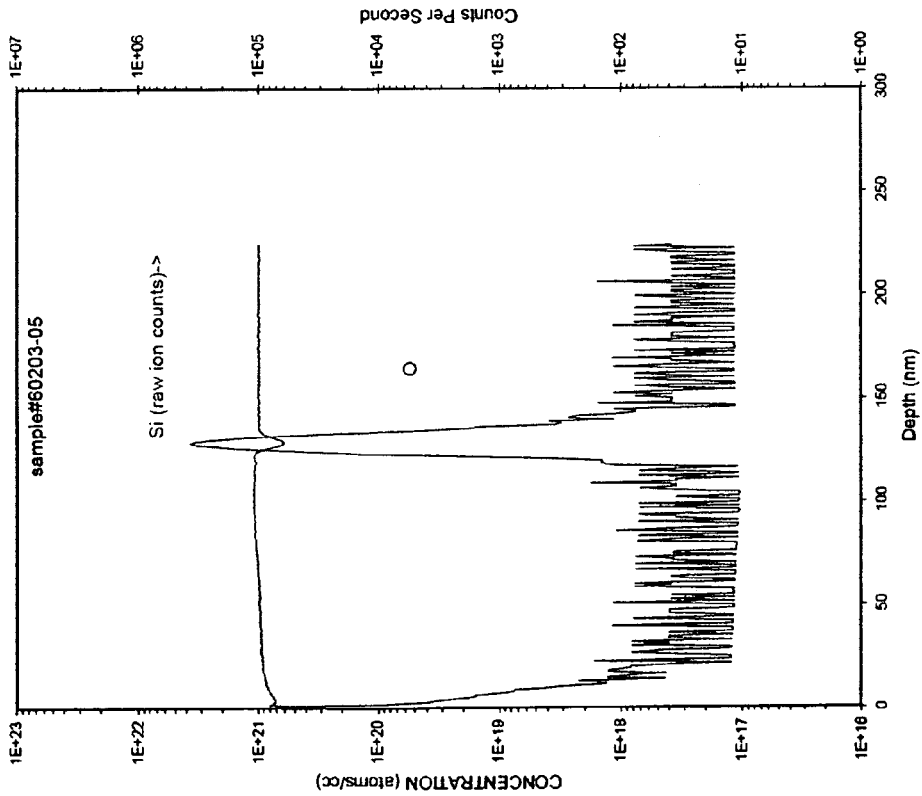

To further support removal of the oxygen species from the interface, we prepared samples for Secondary Ion Mass Spectrometry analysis, commonly called SIMS. As shown in FIGS. 12 and 13 (which correspond respectively to FIGS. 10 and 11), we measured an oxygen concentration using the Secondary Ion Mass Spectrometry (SIMS) for oxygen concentration (atoms/cm$^3$) (vertical axis) as a function of depth, which has been plotted along the horizontal axis. The as-cleaved sample in FIG. 12 shows a oxygen concentration of 2.1 E15 cm-2 consistent with a SiOx stochiometry of x=0.17 while FIG. 13 shows that the interfacial oxygen is completely eliminated. These experimental findings prove the operation of the present method according to a specific embodiment.

Figure 14:
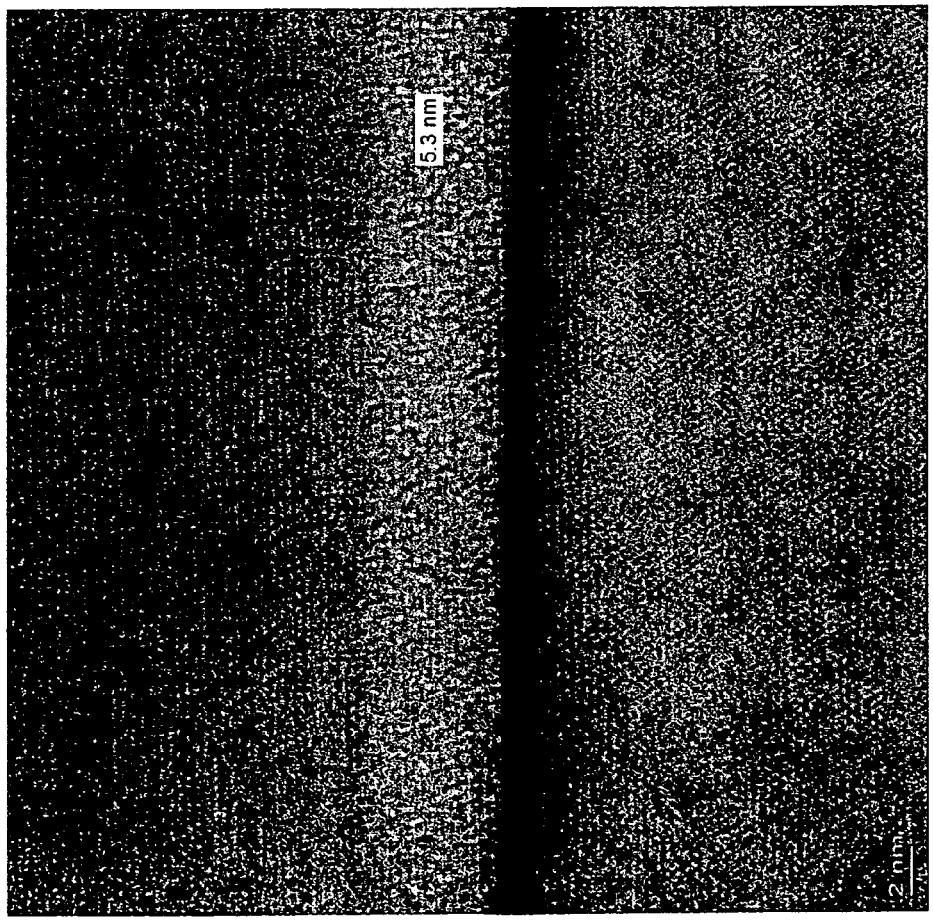

In yet an alternative experiment, we also proved that maintaining a rough cleaved surface, which is "as cleaved" or subjected to a layer transfer process called SmartCut process by Soitec, SA without smoothing or a process called Eltran by Canon Inc., maintains the oxygen species within the substrate and at the interface region according to a specific embodiment. Alternatively, the interface region may be completely free of oxygen species but such oxygen species have accumulated at the as cleaved surface and/or roughened surface, which acts as gettering sites. FIG. 14 shows a 1200 C, 1 hour argon anneal process on an as-cleaved substrate (200 nm (100) 45 degree rotated CZ film on a 200 mm denuded-zone (100) substrate) and shows a 5.3 nm interfacial layer. The TEM shows the interfacial oxide dissolution process was stopped by the gettering action of the defective layer close to the surface. The near-surface oxygen concentration for this sample as measured by SIMS was 7.1E15 cm-2 as compared to 2.3E13 cm-2 for the as-cleaved (non-annealed) sample, thus supporting the case that oxygen diffusion occurred but any appreciable dissolution was stopped by the oxygen gettering and pile-up near the as-cleaved surface. In a specific embodiment, the present method can be used to accumulate the oxygen species at the surface, which is later treated and removed using a mechanical removal or selective etching process using an oxide etchant. Such oxide etchant selectively removes the accumulated oxygen species, and silicon therein to a clean single crystal silicon surface region. Of course, there can be other variations, modifications, and alternatives.

Additionally processes may include repeating the layer transfer processes to form resulting multi-layered substrate structure according to a specific embodiment. The structure includes bulk substrate. The bulk substrate includes an overlying layer, which may be a layer transferred layer. The overlying layer includes layer transferred layer, which has processed and completed device structures thereon. Overlying layer includes one or more layers, which also may be layer transferred, deposited, or any combination of these, according to a specific embodiment. Additionally, the thermal process can include a single and/or multiple thermal processes, which are the same or different according to a specific embodiment. Of course, there can be other variations, modifications, and alternatives.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for fabricating bonded substrate structures, the method comprising,
providing a thickness of single crystal silicon material transferred from a first silicon substrate coupled to a second silicon substrate, the second silicon substrate having a second surface region that is joined to a first surface region from the thickness of single crystal silicon material to form of an interface region having a first characteristic including a silicon oxide material between the thickness of single crystal silicon material and the second silicon substrate;
subjecting the interface region to a thermal process to cause a change to the interface region from the first characteristic to a second characteristic, the second characteristic being free from the silicon oxide material and being an epitaxially formed silicon material provided between the thickness of single crystal silicon material and the second silicon substrate; and
maintaining the interface region free of multiple voids during the thermal process to form the epitaxially formed silicon material to electrically couple the thickness of single crystal silicon material to the second silicon substrate,
the method further comprising performing a non-contact smoothing process on a cleaved surface of the thickness of single crystal silicon.

2. The method of claim 1 wherein the first silicon substrate is a first silicon wafer and the second silicon substrate is a second silicon substrate.

3. The method of claim 1 wherein the one or more voids comprises a plurality of hydrogen species.

4. The method of claim 1 wherein the one or more voids can be provided by a diffusion process having a first rate characteristic.

5. The method of claim 1 wherein the one or more voids comprises a plurality of water species.

6. The method of claim 1 wherein the one or more voids comprises a plurality of hydroxide species.

7. The method of claim 1 wherein the second characteristic is a substantially oxygen free characteristic.

8. The method of claim 1 wherein the second characteristic comprises an epitaxially formed substantially single crystal silicon material.

9. The method of claim 1 wherein the thermal process comprises subjecting the joined thickness of single crystal silicon material and the second substrate to an argon bearing environment at a temperature greater than about 1000 Degrees Celsius.

10. The method of claim 1 wherein the thermal process comprises subjecting the joined thickness of single crystal silicon material and the second substrate to an inert gas environment at a temperature greater than about 1000 Degrees Celsius.

11. The method of claim 1 wherein the interface region having the first characteristic comprises an oxide layer of less than 10 nanometers.

12. The method of claim 1 wherein the thermal process causes one or more oxide species from the silicon oxide to diffuse from the interface region.

13. The method of claim 1 wherein the thermal process causes one or more of the oxide species from the silicon oxide to diffuse from the interface region to a region outside of the thickness of single crystal silicon material and the second silicon substrate.

14. The method of claim 1 if wherein the thermal process causes substantially all of the oxide species from the silicon oxide to diffuse from the interface region to form the epitaxial silicon material.

15. The method of claim 1 wherein the thermal process comprises subjecting the joined thickness of single crystal silicon and the second substrate to a hydrogen gas environment at a temperature greater than about 1000 Degrees Celsius.

16. The method of claim 1 wherein the non-contact smoothing process comprises an argon anneal process and/or chemical mechanical polishing process provided before the thermal treatment.

17. The method of claim 1 wherein the non-contact smoothing process comprises an epi-smoothing process, the epi-smoothing process using a HC1 gas and H2 gas species.

18. The method of claim 1 wherein the smoothing process is provided in a chamber of a cluster tool.

19. The method of claim 1 wherein the smoothing process comprises an in-situ annealing process provided in a chamber of a cluster tool.

20. The method of claim 1 further comprising forming a second layer overlying a cleaved surface of the thickness of silicon material, the second layer comprising an epitaxially formed silicon bearing material.

21. The method of claim 20 wherein the forming of the second layer is provided within a chamber of a cluster tool.

22. The method of claim 1 wherein the thickness of silicon material comprises a silicon germanium material.

23. The method of claim 1 wherein the thickness of silicon material is in a first orientation and the second silicon substrate is in a second orientation.

24. The method of claim 1 wherein the thickness of silicon material is in a first orientation and the second silicon substrate is in a second orientation, the thickness of silicon material being characterized by one or more strained regions.

25. The method of claim 1 wherein the second silicon substrate is a silicon on insulator substrate.

26. A method for fabricating bonded substrate structures, the method comprising:
providing a thickness of single crystal silicon material transferred from a first silicon substrate coupled to a second silicon substrate, the second silicon substrate having a second surface region that is joined to a first surface region from the thickness of single crystal silicon material to form of an interface region having a first characteristic including a silicon oxide material between the thickness of single crystal silicon material and the second silicon substrate; and
subjecting the interfere region to a thermal process to cause a change to the interface region from the first characteristic to a second characteristic to electrically couple the thickness of single crystal silicon material to the second silicon substrate, the second characteristic being free from the silicon oxide material and being an epitaxially formed silicon material provided between the thickness of single crystal silicon material and the second silicon substrate, the method further comprising performing a non-contact smoothing process on a cleaved surface of the thickness of single crystal silicon.

27. The method of claim 26 wherein the first silicon substrate is a first silicon wafer and the second silicon substrate is a second silicon substrate.

28. The method of claim 26 wherein the second characteristic is a substantially oxygen free characteristic.

29. The method of claim 26 wherein the second characteristic comprises an epitaxially formed substantially single crystal silicon material.

30. The method of claim 26 wherein the thermal process comprises subjecting the joined thickness of single crystal silicon material and the second substrate to an argon bearing environment at a temperature greater than about 1000 Degrees Celsius.

31. The method of claim 26 wherein the thermal process comprises subjecting the joined thickness of single crystal silicon material and the second substrate to an inert gas environment at a temperature greater than about 1000 Degrees Celsius.

32. The method of claim 26 wherein the interface region having the first characteristic comprises an oxide layer of less than 10 nanometers.

33. The method of claim 26 wherein the thermal process causes one or more oxide species from the silicon oxide to diffuse from the interface region.

34. The method of claim 26 wherein the thermal process causes one or more of the oxide species from the silicon oxide to diffuse from the interface region to a region outside of the thickness of single crystal silicon material and the second silicon substrate.

35. The method of claim 26 wherein the thermal process causes substantially all of the oxide species from the silicon oxide to diffuse from the interface region to form the epitaxial silicon material.

36. The method of claim 26 wherein the thermal process comprises subjecting the joined thickness of single crystal silicon and the second substrate to a hydrogen gas environment at a temperature greater than about 1000 Degrees Celsius.

37. The method of claim 26 wherein the non-contact smoothing process comprises an argon anneal process and/or chemical mechanical polishing process provided before the thermal treatment.

38. The method of claim 26 wherein the non-contact smoothing process comprises an epi-smoothing process, the epi-smoothing process using a HC1 gas and H2 gas species.

39. The method of claim 26 wherein the smoothing process is provided in a chamber of a cluster tool.

40. The method of claim 26 wherein the smoothing process comprises an in-situ annealing process provided in a chamber of a cluster tool.

41. The method of claim 26 further comprising forming a second layer overlying a cleaved surface of the thickness of silicon material, the second layer comprising an epitaxially formed silicon bearing material.

42. The method of claim 41 wherein the forming of the second layer is provided within a chamber of a cluster tool.

43. The method of claim 26 wherein the thickness of silicon material comprises a silicon germanium material.

44. The method of claim 26 wherein the thickness of silicon material is in a first orientation and the second silicon substrate is in a second orientation.

45. The method of claim 26 wherein the thickness of silicon material is in a first orientation and the second silicon substrate is in a second orientation, the thickness of silicon material being characterized by one or more strained regions.

46. The method of claim 26 wherein the second silicon substrate is a silicon on insulator substrate.

47. A method for fabricating bonded substrate structures, the method comprising:

providing a thickness of single crystal silicon material transferred from a first silicon substrate coupled to a second silicon substrate, the second silicon substrate having a second surface region that is joined to a first surface region from the thickness of single crystal silicon material to form of an interface region having a first characteristic including a silicon oxide material between the thickness of single crystal silicon material and the second silicon substrate, the thickness of single crystal silicon including a surface region having a plurality of trapping sites; and subjecting the interface region to a thermal process to cause a change to the interface region from the first characteristic to a second characteristic to electrically couple the thickness of single crystal silicon material to the second silicon substrate, the second characteristic being free from the silicon oxide material and being an epitaxially formed silicon material provided between the thickness of single crystal silicon material and the second silicon substrate and to cause a portion of the silicon oxide material to be transferred to one or more trapping sites provided on the surface region, the method further comprising performing a non-contact smoothing process on a cleaved surface of the thickness of single crystal silicon.

48. The method of claim 47 further comprising removing the portion of the silicon oxide material provided on the surface region by at least a selective etching process and/or a chemical polishing process.

* * * * *